US011152771B2

(12) United States Patent
Bergamini et al.

(10) Patent No.: US 11,152,771 B2
(45) Date of Patent: Oct. 19, 2021

(54) SOLID-STATE SWITCHING DEVICE OF THE WITHDRAWABLE TYPE INCLUDING A COOLING FLUID TO REMOVE HEAT

(71) Applicant: ABB S.p.A., Milan (IT)

(72) Inventors: Alessio Bergamini, Gazzaniga (IT); Matteo Minuti, Romano di Lombardia (IT)

(73) Assignee: ABB S.P.A., Milan (IT)

( * ) Notice: Subject to any disclaimer, the term of this patent is extended or adjusted under 35 U.S.C. 154(b) by 0 days.

(21) Appl. No.: 16/828,019

(22) Filed: Mar. 24, 2020

(65) Prior Publication Data

US 2020/0313404 A1    Oct. 1, 2020

(51) Int. Cl.
*H02B 1/56* (2006.01)
*H01H 9/52* (2006.01)
(Continued)

(52) U.S. Cl.
CPC ............. *H02B 1/56* (2013.01); *H01H 9/52* (2013.01); *H02B 11/12* (2013.01); *H01H 71/0207* (2013.01)

(58) Field of Classification Search
CPC .... H02B 1/36; H02B 1/56; H02B 11/12–173; H01H 71/0207; H01H 71/123; H01H 89/00; H01Q 9/06
See application file for complete search history.

(56) References Cited

U.S. PATENT DOCUMENTS 8,137,120 B2 *  3/2012  Bortoli .................. H02B 1/56
                                          439/115

9,142,375 B2 *  9/2015  Besana ............. H01H 71/0207
(Continued)

FOREIGN PATENT DOCUMENTS

DE      4325735 A1    2/1994
EP      2256772 A1   12/2010
(Continued)

OTHER PUBLICATIONS

European Patent Office, Search Report issued in corresponding Application No. 19164833.6, dated Jan. 10, 2019, 5 pp.
(Continued)

*Primary Examiner* — Zachary Pape
(74) *Attorney, Agent, or Firm* — Greenberg Traurig, LLP

(57) ABSTRACT

A switching device including a switching unit having one or more electric poles and including, for each electric pole, a first power contact and a second power contact along which a line current can circulate and one or more solid-state switches; and a supporting frame adapted to be fixed to a supporting structure and including, for each electric pole, a third power contact and a fourth power contact along which said line current can circulate. The switching unit is reversibly movable, with respect to said supporting frame, between an insertion position and a withdrawn position. The switching unit includes, for each electric pole, at least a hydraulic circuit along which a cooling fluid can circulate to remove heat generated by said solid-state switches. The hydraulic circuit includes a first hydraulic connector and a second hydraulic connector that are coupled with or separated from a corresponding third hydraulic connector and a corresponding fourth hydraulic connector of said supporting frame, when said switching unit is in said insertion position or in said withdrawn position.

20 Claims, 13 Drawing Sheets

Figure 1:
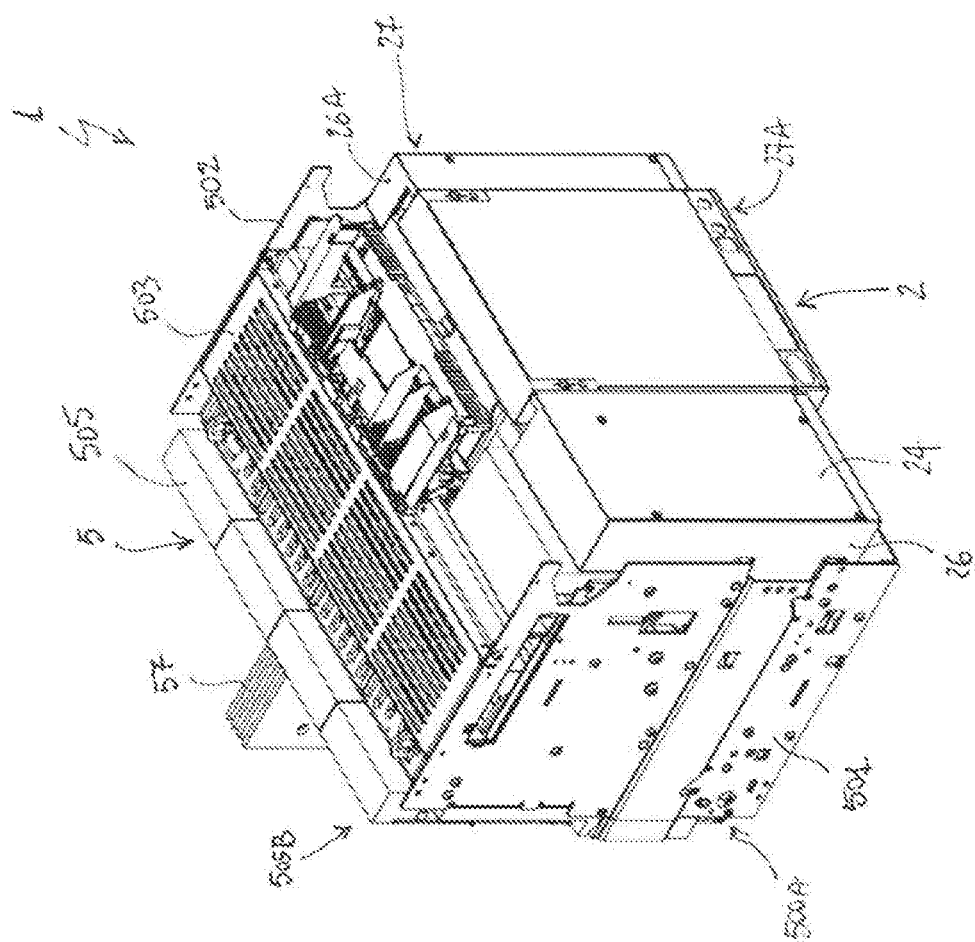
Figure 2:
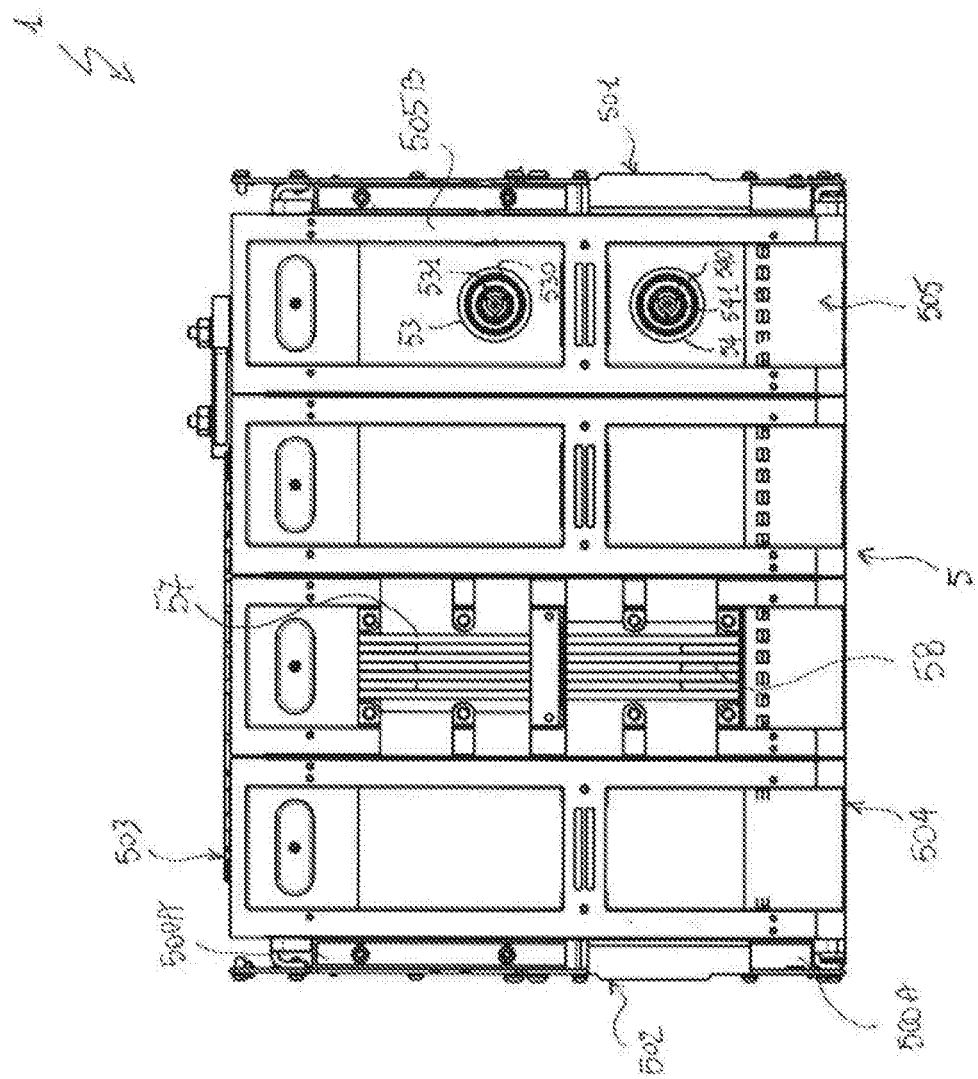
Figure 3:
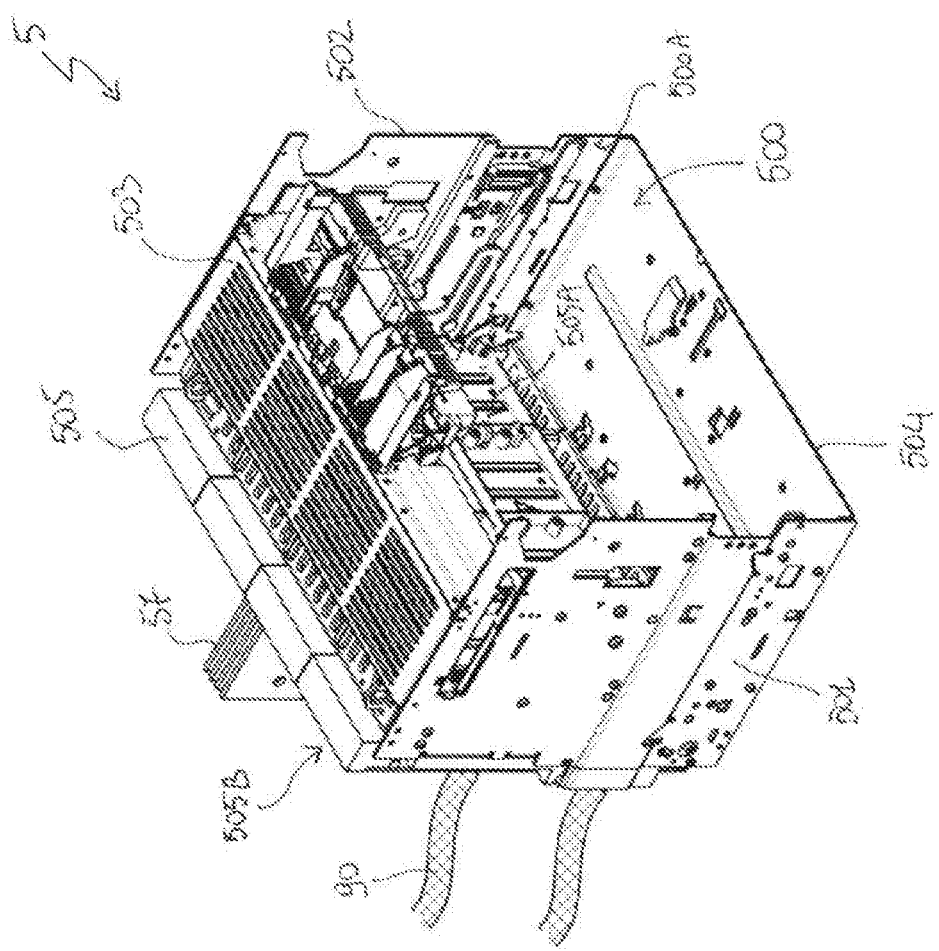
Figure 4:
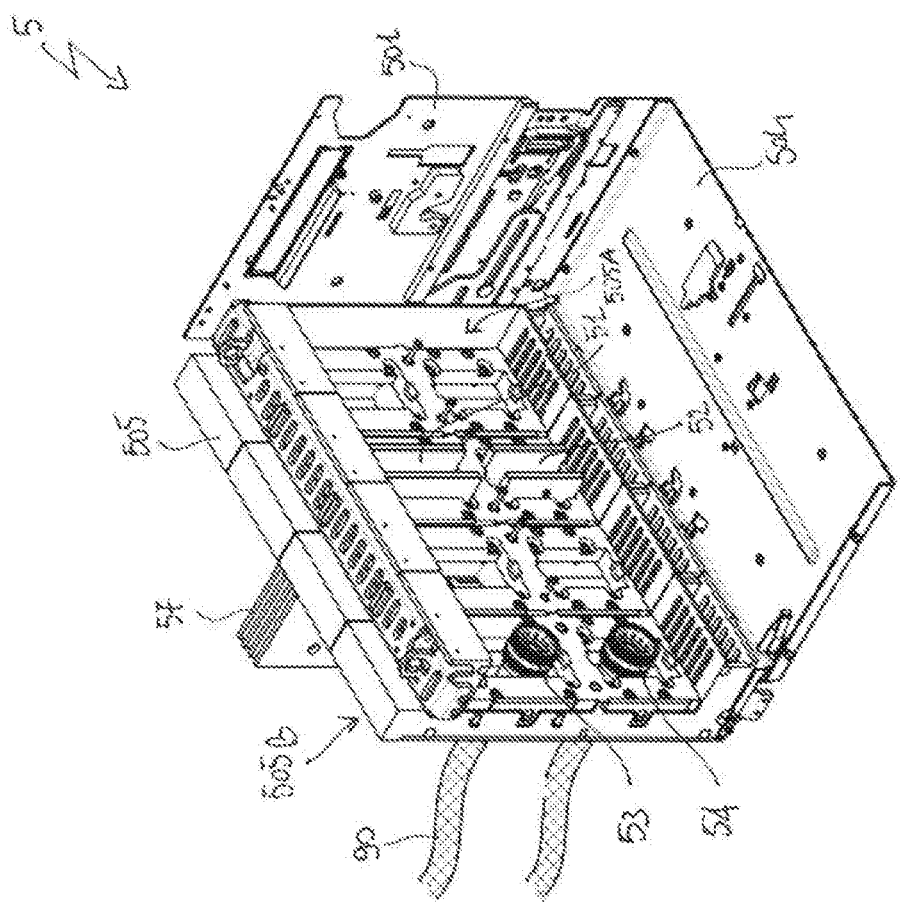
Figure 5:
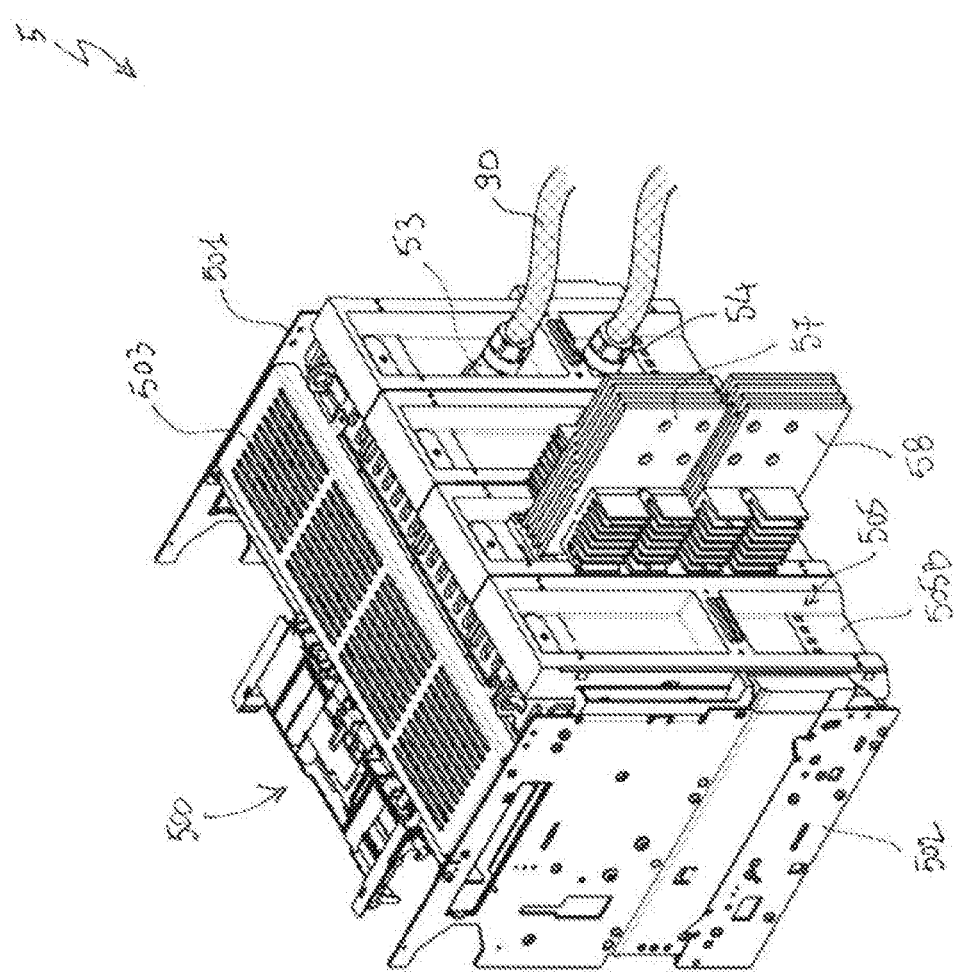

(51) Int. Cl.
*H02B 11/12* (2006.01)
*H01H 71/02* (2006.01)

(56) References Cited

U.S. PATENT DOCUMENTS

| | | | |
|---|---|---|---|
| 9,787,068 B2 * | 10/2017 | Rota Martir | H02B 11/24 |
| 2016/0351352 A1 | 12/2016 | Reich et al. | |
| 2019/0269042 A1 | 8/2019 | Bonnin et al. | |

FOREIGN PATENT DOCUMENTS

| EP | 2690643 A1 | 1/2014 |
|---|---|---|
| WO | 2015180795 A1 | 12/2015 |
| WO | 2018069633 A1 | 4/2018 |

OTHER PUBLICATIONS

Indian Patent Office, Examination Report issued in corresponding Application No. 202044011844, dated Apr. 19, 2021, 5 pp.

* cited by examiner

SOLID-STATE SWITCHING DEVICE OF THE WITHDRAWABLE TYPE INCLUDING A COOLING FLUID TO REMOVE HEAT

The present invention relates to the technical field of the low voltage switching devices, such as circuit breakers, disconnectors, contactors and the like.

For the purposes of the present invention, the term "low voltage" (LV) relates to voltages lower than 1 kV AC and 1.5 kV DC.

As it is known, low voltage switching devices are used in electric circuits or grids to allow the correct operation of specific parts of these latter.

For instance, low voltage switching devices are adapted to ensure the availability of a nominal current necessary for several utilities, enable the proper insertion and disconnection of electric loads, protect (especially circuit breakers) the electric grid and installed electric loads against fault events, such as overloads and short circuits.

Various industrial solutions for the aforementioned switching devices are available on the market.

More traditional electro-mechanical switching devices generally have an external case that houses one or more electric poles, each of which comprises a couple of separable contacts to break and conduct current.

A driving mechanism causes the movable contacts to move between a first closed position, in which they are coupled to the corresponding fixed contacts, and a second open position, in which they are spaced away from the corresponding fixed contacts.

Although such apparatuses have proven to be very robust and reliable, in direct current ("DC") applications, and mainly at relatively high voltages (up to 1500V), their interruption time can be quite long.

As a consequence, electric arcs, which usually strike between mechanical contacts under separation, may consequently last for a relatively long time.

Severe wear of the contacts of the electric poles may thus arise with a consequent remarkable reduction of the electrical endurance, i.e. the number of switching operations that a switching device can perform.

In order to face with such issues, so-called Solid-State Circuit Breakers ("SSCBs") have been designed.

These switching devices include, for each electric pole, one or more solid-state switches for current breaking purposes.

Typically, solid-state switches are semiconductor-based switching devices that can commutate between a conduction state and an interdiction state.

The main advantage of SSCBs resides in that they have a potentially unlimited electrical endurance due to their arc-less breaking operations.

Further, their interruption time is remarkably shorter in comparison with the interruption time of the electro-mechanical switching devices.

Unfortunately, SSCBs generally require intensive cooling to remove heat generated by the current flowing through the solid-state switches, when these latter are in a conduction state.

In order to face with this issue, some SSCBs of the state of the art have been provided with venting devices adapted to generate an air flow removing heat generated by the solid-state switches.

The main drawbacks of this solution consist in a relevant increase of size and weight of the SSCBs and in relatively low efficiency in removing heat in excess.

There are known SSCBs provided with hydraulic circuits to remove heat generated by the solid-state switches.

Currently available SSCBs of this type have a complex structure and are difficult to install on the field due to the need of manually arranging hydraulic connections to allow the hydraulic circuit on-board the switching unit to be fed with a cooling fluid. Therefore, these apparatuses typically show relatively high industrial costs.

Additionally, currently available solutions for arranging the above-mentioned hydraulic connections are not generally suitable for implementation in SSCBs of the so-called "withdrawable type", i.e. provided with a switching unit reversibly movable between an insertion position and a withdrawn position with respect to a supporting frame fixed to the electric switchboard.

In the market, it is still felt the demand for innovative technical solutions capable of solving or mitigating the drawbacks mentioned above.

In order to respond to this need, the present invention provides a solid-state switching device of the withdrawable type, according to the following claim 1 and the related dependent claims.

In a general definition, the switching device, according to the invention comprises:

a switching unit having one or more electric poles and comprising, for each electric pole, a first power contact and a second power contact along which a line current can circulate and one or more solid-state switches electrically connected with said first and second power contacts and switchable in a conduction state or in an interdiction state to allow or interrupt a flow of said line current;

a supporting frame adapted to be fixed to a supporting structure and comprising, for each electric pole, a third power contact and a fourth power contact along which said line current can circulate.

In operation, the switching unit is reversibly movable, with respect to said supporting frame, between an insertion position and a withdrawn position.

When said switching unit is in said insertion position, said first power contact and said second power contact are coupled with said third power contact and said fourth power contact, respectively.

When said switching unit is in said withdrawn position, said first power contact and said second power contact are separated from said third power contact and said fourth power contact, respectively.

According to the invention, said switching unit comprises, for each electric pole, at least a first hydraulic connector and a second hydraulic connector along which a cooling fluid adapted to remove heat generated by said solid-state switches can circulate.

According to the invention, said supporting frame comprises at least a third hydraulic connector and a fourth hydraulic connector along which said cooling fluid can circulate.

Preferably, said third hydraulic connector and said fourth hydraulic connector are, in operation, in fluid-dynamic communication with a fluid source of said cooling fluid.

When said switching unit is in said insertion position, said first hydraulic connector and said second hydraulic connector are coupled with said third hydraulic connector and said fourth hydraulic connector, respectively.

When said switching unit is in said withdrawn position, said first hydraulic connector and said second hydraulic connectors are separated from said third hydraulic connector and said fourth hydraulic connector, respectively.

According to an aspect of the invention, said first hydraulic connector second hydraulic connector, third hydraulic connector and fourth hydraulic connectors comprise, respectively:

a first passage, a second passage, a third passage and a fourth passage for said cooling fluid; and first valve means, second valve means, third valve means and fourth valve means operatively associated with said first passage, second passage, third passage and fourth passage, respectively.

Conveniently, said first valve means, second valve means, third valve means and fourth valve means are adapted to allow said cooling fluid to flow along said first passage, second passage, third passage and fourth passage or to obstruct said first passage, second passage, third passage and fourth passage.

According to an aspect of the invention, said first and second power contacts are arranged at an external side of a first back wall of said switching unit and said third and fourth power contacts are arranged at an internal side of a second back wall of said supporting frame.

According to an aspect of the invention, said first and second hydraulic connectors are arranged at an external side of a first back wall of said switching unit and said third and fourth hydraulic connectors are arranged at an internal side of a second back wall of said supporting frame.

Conveniently, said first and second back walls are operatively coupled one with another, when said switching unit in said insertion position According to an aspect of the invention, said supporting frame comprises, for each electric pole, a fifth power contact and a sixth power contact along which said line current can circulate, said fifth and sixth power contacts being electrically connected with said third and fourth power contacts, respectively, and being, in operation, electrically connected with a first electric line portion and a second electric line portion, respectively.

Preferably, said fifth and sixth power contacts are arranged at an external side of a second back wall of said supporting frame.

According to an aspect of the invention, said switching unit comprises an intermediate hydraulic circuit section in fluid-dynamic communication with said first and second hydraulic connectors.

Preferably, said intermediate hydraulic circuit section comprises one or more heat exchange portions in fluid communication one with another. Conveniently, each heat exchange portion includes one or more heat exchanging surfaces for absorbing heat from a corresponding solid-state switch.

Further characteristics and advantages of the present invention shall emerge more clearly from the description of preferred but not exclusive embodiments illustrated purely by way of examples and without limitation in the attached drawings, in which:

FIGS. 1-7 schematically show different views of the switching device, according to the invention;

FIGS. 8-13 schematically show different partial views of the switching device, according to the invention, in different operating positions.

With reference to the mentioned figures, in a first aspect, the present invention relates to a switching device 1 for LV circuits, such as a LV circuit breaker, disconnector, contactor and the like.

The switching device 1 includes a switching unit 2 comprising one or more electric poles 2A.

The number of electric poles of the switching unit 2 may vary, according to the needs.

In the embodiment shown in the cited figures, the switching unit 2 comprises a single electric pole 2A. However, according to other embodiments of the invention (not shown), the switching unit 2 may include two or more electric poles.

Preferably, the switching unit 2 is shaped with a box-like shaped structure and it has a plurality of first walls, which have internal sides defining a volume, in which the electric poles 2A and other components are accommodated, and external sides opposite to said internal sides.

Preferably, the switching unit 2 comprises a first front wall 24 and a first back wall 25 opposite one to another, first lateral walls 26, 27 opposite one to another and substantially perpendicular to the walls 24 and 25, and first upper and lower walls 26A, 27A opposite one to another and substantially perpendicular to the walls 24, 25, 26, 27.

In a normal operative positioning of the switching device 1 (as shown in the cited figures), the walls 24, 25, 26, 27 are vertically oriented with respect to the ground while the upper and lower walls 26A, 27A are horizontally oriented.

For each electric pole 2A, the switching unit 2 comprises a first power contact 21 and a second power contact 22 along which a line current can circulate.

Preferably, the power contacts 21, 22 are arranged at the first back wall 25 of the switching unit 2, more particularly at an external side 25B of said first back wall.

The power contacts 21, 22 may be of known type.

Figure 6:
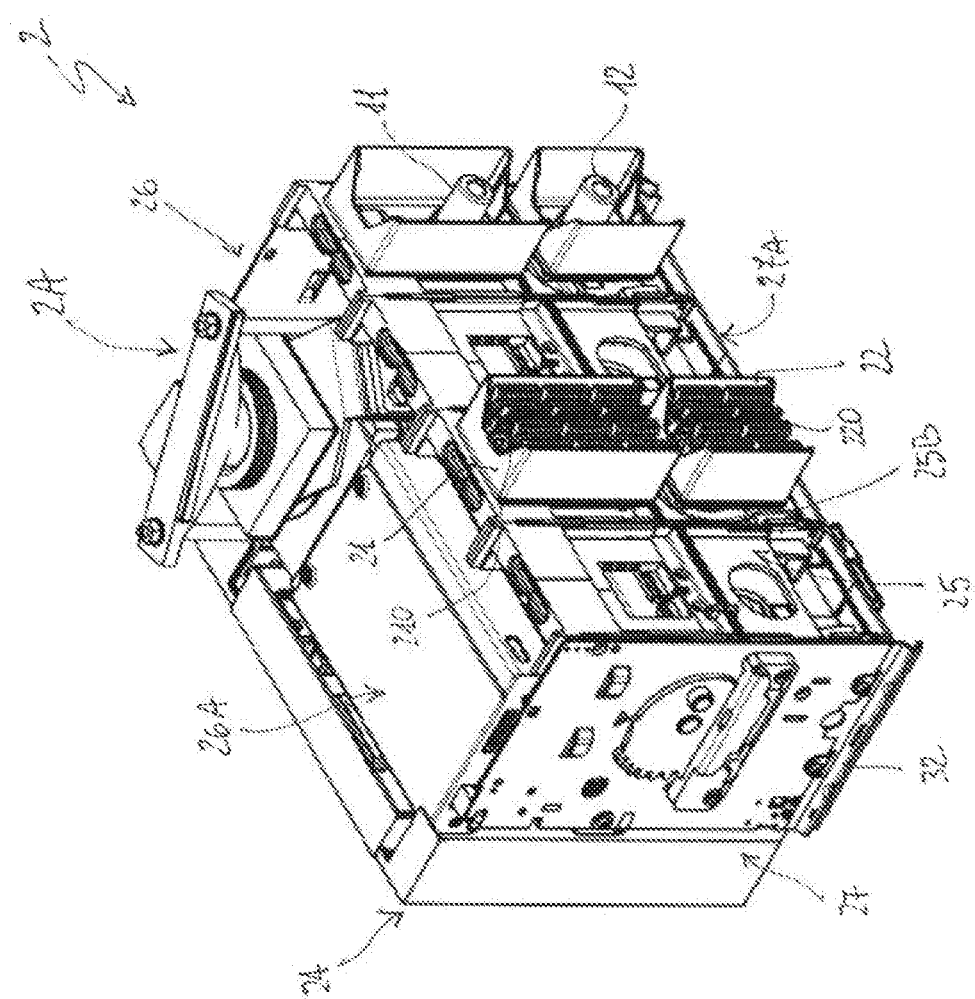

In the embodiment shown in the cited figures, each electric contact 21, 22 is formed by multiple plier groups 210-220, each comprising multiple overlapped pairs of flexible and conductive shaped arms facing one to another. Conveniently, each electric contact 21, 22 may comprise parallel contact portions, each formed two or more plier groups aligned along a same axis (FIG. 6).

For each electric pole, the switching unit 2 comprises one or more solid-state switches 20, which are advantageously semiconductor-based switching devices, such as, for example, Power MOSFETs, Insulated Gate Bipolar Transistors ("IGBTs"), Gate Turn-Off Thyristors (GTOs), Integrated Gate-Commutated Thyristors ("IGCTs") or the like.

As shown in the cited figures, for each electric pole, the switching unit 2 preferably comprise a plurality of solid-state switches 20 that may be electrically connected in series or in parallel in a known manner, according to the needs.

Preferably, the solid-state switches 20 are arranged along a stack axis and are fixed in their operative position by a suitable supporting arrangement 29 and other supporting components (not shown) solidly fixed with the walls of the switching unit.

In other embodiments of the present invention (not shown), however, the switching unit 2 may comprise a single solid-state switching device for each electric pole. In this case, differently arrangements for fixing said single solid-state switch in its operative position may be conveniently adopted.

According to the invention, the switching unit 2 comprises, for each electric pole, at least a hydraulic circuit 10 along which a cooling fluid can circulate to remove heat generated by the solid-state switches.

In general, the cooling fluid may be any suitable heat-transfer liquid of known type (e.g. water) or any suitable heat-transfer gas of known type (e.g. R410A or another refrigerant gas of the type used in air conditioning systems).

In the embodiment shown in the cited figures, the switching unit 2 comprises a single hydraulic circuit 10 for each electric pole (in this case the single electric pole 2A).

However, according to other embodiments of the invention (not shown), the switching unit 2 may include two or more first hydraulic circuits 10 for each electric pole.

The switching unit 2 comprises at least a first hydraulic connector 11 and a second hydraulic connector 12, which are part of a corresponding hydraulic circuit 10.

Preferably, the first hydraulic connector 11 comprises a first passage 110 for the cooling fluid and first valve means 111 operatively associated to said first passage to allow or prevent said cooling fluid to flow along said first passage.

Preferably, the second hydraulic connector 12 comprises a second passage 120 for the cooling fluid and second valve means 121 operatively associated to said second passage to allow or prevent said cooling fluid to flow along said second passage.

The hydraulic connectors 11, 12 may be of known type. As an example, they may be comprise suitable shaped sleeves (e.g. having an external geometry of the male type) as shown in the cited figures to define the respective passages 110, 120.

Also, the valve means 111, 121 may be known type. As an example, they may include a fixed shaped pin as shown in the cited figures or fixed sleeve portions of said hydraulic connectors 11, 12 or movable pins or balls operatively associated with suitable elastic means, e.g. a spring or a flexible tongue.

Preferably, the hydraulic connectors 11, 12 are arranged at the first back wall 25 of the switching unit 2, more particularly at the external side 25B of said first back wall.

Preferably, a hydraulic circuit 10 comprises an intermediate hydraulic circuit section 13, which is part of a corresponding hydraulic circuit 10.

The intermediate hydraulic circuit section 13 is in fluid-dynamic communication with said first and second hydraulic connectors.

For the sake of clarity, it is specified that, within the scope of the present invention, the expression "in fluid-dynamic communication" referred to some parts of the switching device has to be intended with reference to an operating condition, in which the above-mentioned cooling fluid can flow between said parts, passing through suitable ducts or ports.

Preferably, the intermediate hydraulic circuit section 13 comprises one or more heat exchange portions 14 in fluid communication one with another through suitable ducts 15.

Preferably, each heat exchange portions 14 comprises one or more heat exchanging surfaces (not shown) for absorbing heat generated by a corresponding solid-state switch 20, when this latter is in a conduction state.

Each heat exchange portion 14 may be conveniently arranged in such a way to form a so-called "cold plate" element in thermal contact with a corresponding solid-state switches 20.

However, according to other embodiments of the invention, the heat exchanging portions 14 may be differently configured.

Preferably, the intermediate hydraulic circuit section 13 (e.g. the heat exchange portions 14 and the ducts 15) is at least partially made of an electrically insulating material, e.g. a plastic material.

According to some embodiments of the invention, at least some parts of the intermediate hydraulic circuit section 13 can be made of a metal material, e.g. Aluminum.

According to the invention, the switching device 1 comprises a supporting frame 5 adapted to be fixed to a supporting structure, e.g. the supporting structure of an electric switchboard.

Preferably, the supporting frame 5 is shaped with an open-box-like shaped structure and it has a plurality of second walls having internal sides defining a volume, in which the switching unit 2 can be at least partially accommodated, and external sides opposite to said internal sides.

Preferably, the supporting frame 5 comprises a front opening 500 and a second back wall 505 opposite and in distal position with respect to said opening, second lateral walls 501, 502 opposite one to another and substantially perpendicular to the back wall 505, and second upper and lower walls 503, 504 opposite one to another and substantially perpendicular to the walls 501, 502, 505.

In a normal operative positioning of the switching device 1 (as shown in the cited figures), the walls 501, 502, 505 are vertically oriented with respect to the ground while the upper and lower walls 503, 504 are horizontally oriented.

Preferably, the second back wall 505 has an internal side 505A, which generally faces the front opening 500 and the external side 25B of the first back wall 25 of the switching unit 2, and an opposite external side 505B, at which the supporting frame 5 is adapted to be fixed to the above-mentioned supporting structure.

The supporting frame 5 comprises, for each electric pole of the switching unit 2, a third power contact 51 and a fourth power contact 52 along which a power line current can circulate.

Preferably, the power contacts 51, 52 are arranged at the second back wall 505 of the switching unit 2, more particularly at the internal side 505A of said second back wall.

The power contacts 51, 52 may be of known type. As an example, each electric contact 51, 52 may be formed by a pair of shaped blades parallel one to another (FIG. 4) and arranged in such a way to be aligned and have a complementary shape with respect to the above-described portions of the power contacts 21, 22. In this way, the electric contacts 21, 22 and 51, 52 can be joined with a shape mechanical coupling.

Preferably, the supporting frame 5 comprises, for each electric pole of the switching unit 2, a fifth power contact 57 and a sixth power contact 58 along which a line current can circulate. The fifth and sixth power contacts 57, 58 are electrically connected with the third and fourth power contacts 51, 52, respectively. To this aim, electrical connection means of known type may be suitably adopted.

The power contacts 57, 58 are adapted to be electrically connected with a first electric line portion and a second electric line portion (not shown) of a LV electric line, respectively. To this aim, additional electrical connection means of known type may be suitably adopted.

Preferably, the power contacts 57, 58 are arranged at the second back wall 505 of the switching unit 2, more particularly at the external side 505B of said second back wall.

The power contacts 57, 58 may be of known type. As an example, each power contact 57, 58 may be formed by a group of parallel blades.

Preferably, the supporting frame 5 comprises a third hydraulic connector 53 and a fourth hydraulic connector 54 along which said cooling fluid can circulate.

Preferably, the third hydraulic connector 53 comprises a third passage 530 for the cooling fluid and a third valve means 531 operatively associated to said third passage to allow or prevent the flow of said cooling fluid along said third passage.

Preferably, the fourth hydraulic connector 54 comprises a fourth passage 540 for the cooling fluid and a fourth valve means 541 operatively associated to said fourth passage to allow or prevent the flow of said cooling fluid along said third passage.

The hydraulic connectors 53, 54 are adapted to be in fluid-dynamic communication with a source of said cooling fluid (not shown). To this aim, they are arranged in such a way to pass through the second back wall 505 of the supporting frame 5 and are hydraulically connected with the source of cooling fluid through hydraulic connection means 90 of known type (e.g. by means of pipes having threaded ends that can be screwed on the hydraulic connectors 53, 54).

The hydraulic connectors 53, 54 may be of known type. As an example, they may comprise suitable shaped sleeves to define the respective passages 530, 540. Conveniently the sleeves of the hydraulic connectors 53, 54 have a complementary geometrical shape with respect to those of hydraulic connectors 11, 12 (e.g. having an external geometry of the female type) as shown in the cited figures.

Also, the valve means 531, 541 may be known type. As an example, they may include movable pins or balls operatively associated with suitable elastic means, e.g. a spring or a flexible tongue as shown in the cited figures or include fixed shaped pins or fixed sleeve portions of said hydraulic connectors 53, 54.

According to the invention, the switching unit 2 is movable with respect to the supporting frame 5, namely between an insertion position A (FIG. 8) and a withdrawn position B (FIG. 9), and vice-versa.

A movement of the switching unit 2 between the insertion position A and the withdrawn position B forms a withdrawn operation of the switching unit 2 whereas an opposite movement of the switching unit 2 between the withdrawn position B and the insertion position A forms an insertion operation of the switching unit 2.

A withdrawn operation of the switching unit 2 may, for example, be aimed at achieving a galvanic insulation of the switching unit 2 from external devices or power buses, so as to provide protection functionalities and/or other network management functionalities or to perform maintenance operations on the switching device 1.

An insertion operation of the switching unit 2 may, for example, be aimed at re-establishing an electrical connection of the switching unit 2 with external devices or power buses, so as to provide protection functionalities and/or other network management functionalities or after the execution of maintenance operations on the switching device 1.

During any transition between the insertion position A and the withdrawn position B, or vice-versa, the switching unit 2 performs a translatory movement that occurs along a direction substantially perpendicular to the second back wall 505 of the supporting frame 5. Preferably, the lateral walls 26, 27 of the switching unit 2 are slidingly coupled with the lateral walls 501, 502 of the supporting frame 5, respectively. To this aim, suitably coupling means including rollers, guiding edges 500A or the like may be suitably arranged, as partially shown in the cited figures.

Depending on the relative positioning of the switching unit 2 with respect to the supporting frame 5, the second back wall 505 of the supporting frame 5 is operatively coupled or separated, at its internal side 505A, with or from the first back wall 25 of the switching unit 2, at the external side 25B of said first back wall.

When the switching unit 2 is in the insertion position A, the switching unit 2 is accommodated in the internal volume defined by the supporting frame 5 and the back wall unit 25B of the switching unit 2 is operatively coupled with the second back wall 505 of the supporting frame 5.

When the switching unit 2 is in the insertion position A, the first and second power contacts 21, 22 of the switching unit 2 and the third and fourth power contacts 51, 52 of the supporting frame 5 are mutually coupled, respectively, in such a way to be electrically connected and a power line current can flow between them.

When the switching unit 2 is in the insertion position A, the first and second hydraulic connectors 11, 12 are coupled with the third and fourth hydraulic connectors 53, 54, respectively, in such a way to be hydraulically connected and the cooling fluid can circulate between them.

When the switching unit 2 is in the withdrawn position B, the switching unit 2 is positioned out from the internal volume defined by the supporting frame 5 and the back wall unit 25B of the switching unit 2 is separated from the second back wall 505 of the supporting frame 5. When the switching unit 2 is in the withdrawn position B, the power contacts 21, 22 of the switching unit 2 and the power contacts 51, 52 of the supporting frame 5 are separated in such a way to be electrically disconnected and a power line current cannot flow between them.

When the switching unit 2 is in the withdrawn position B, the first and second hydraulic connectors 11, 12 are separated from the third and fourth hydraulic connectors 53, 54 in such a way to be hydraulically disconnected and the cooling fluid cannot circulate between them.

Preferably, the switching device 1 comprises actuating means 3 for reversibly moving the switching unit 2 between the mentioned insertion position A and withdrawn position B.

In order to provide the mechanical energy for moving the switching unit 2, the actuating means 3 preferably comprises at least an electric motor (not shown), which may be suitably fed by an auxiliary power supply.

Preferably, the switching unit 2 can be also manually operated.

Figure 7:
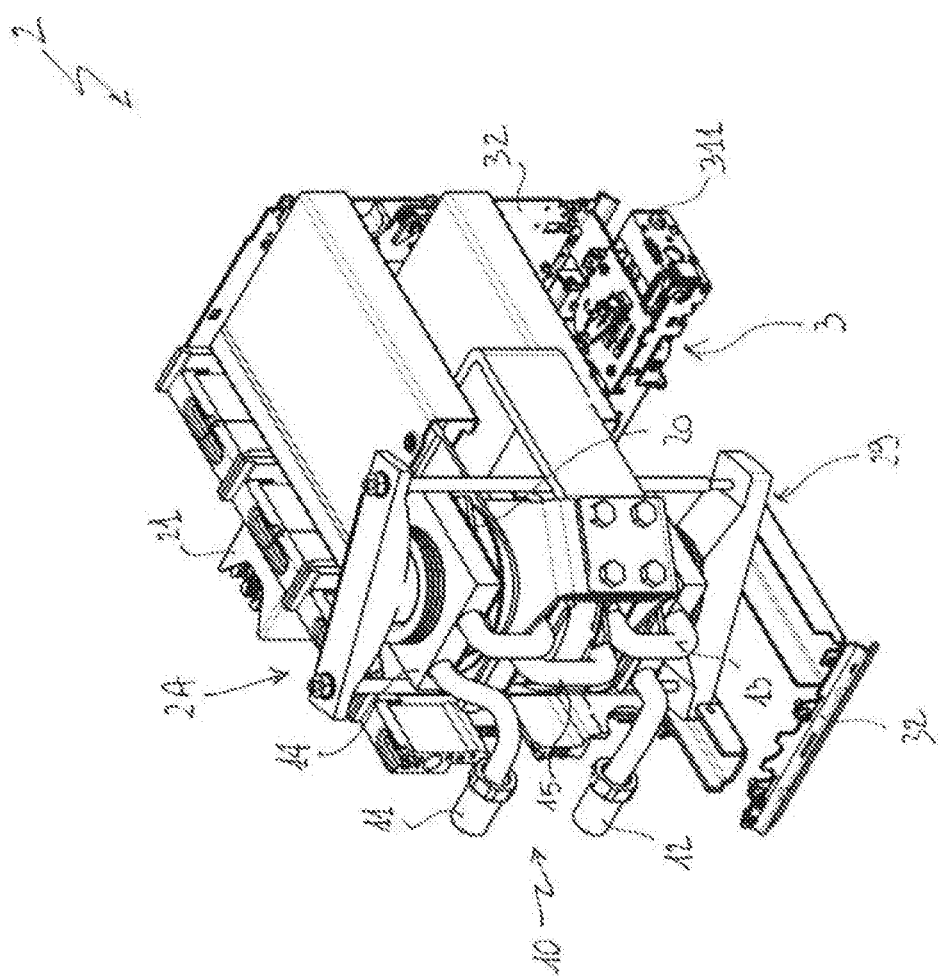

Preferably, the actuating means 3 comprise an actuating mechanism (not shown) that can be manually operated by an actuation tool (not shown, e.g. a crank) to be inserted in a suitable manoeuvring seat 311, which may be accessed, for example, by a user at the front wall 24 of the switching unit 2 (FIG. 7).

Preferably, the switching device 1 comprises motion transmission means configured to transmit the mechanical energy for moving the switching unit 2, which is received from the actuating means 3.

Said motion transmission means may comprise a carriage 32 solidly connected with the first bottom wall 25 and the first lateral walls 26, 27 of the switching unit 2 and at least a kinematic chain (not shown) to transform the motion imparted by the actuating means 3 (in particular by the above-mentioned electric motor or actuating mechanism) in a translatory motion of the movable carriage 32 and, consequently, of the switching unit 2.

In possible embodiments of the present invention (not shown), the actuating means 3 may comprise one or more actuating springs (not shown) that are operatively associated with the switching unit 2 (namely with the movable carriage 32) and the supporting frame 5.

Conveniently, said actuation springs are adapted to move the switching unit 2 only during a withdrawn operation of this latter by releasing elastic energy stored during an insertion operation of the switching unit 2, upon compression.

Preferably, the switching device 1 comprises control means (not shown), which are configured to control the operation of switching device.

Preferably, said control means comprise one or more digital processing devices (not shown), e.g. microcontrollers.

Preferably, said control means include a control module to control the actuating means 3, which may be positioned at one of the lateral walls 503, 504 of the supporting frame 5 for space saving purposes, and a further control unit positioned on board the switching unit 2 or in a remote position with respect to this latter.

Preferably, the above-mentioned control means are fed by an auxiliary power supply (not shown).

In the following, operation of the first and second hydraulic connectors 11-12 and of the third and fourth coupling connectors 53-54, during an insertion operation or a withdrawal operation of the switching unit 2, is described in more details with reference to the embodiment of the invention shown in the cited figures (FIGS. 8-13).

Figure 8:
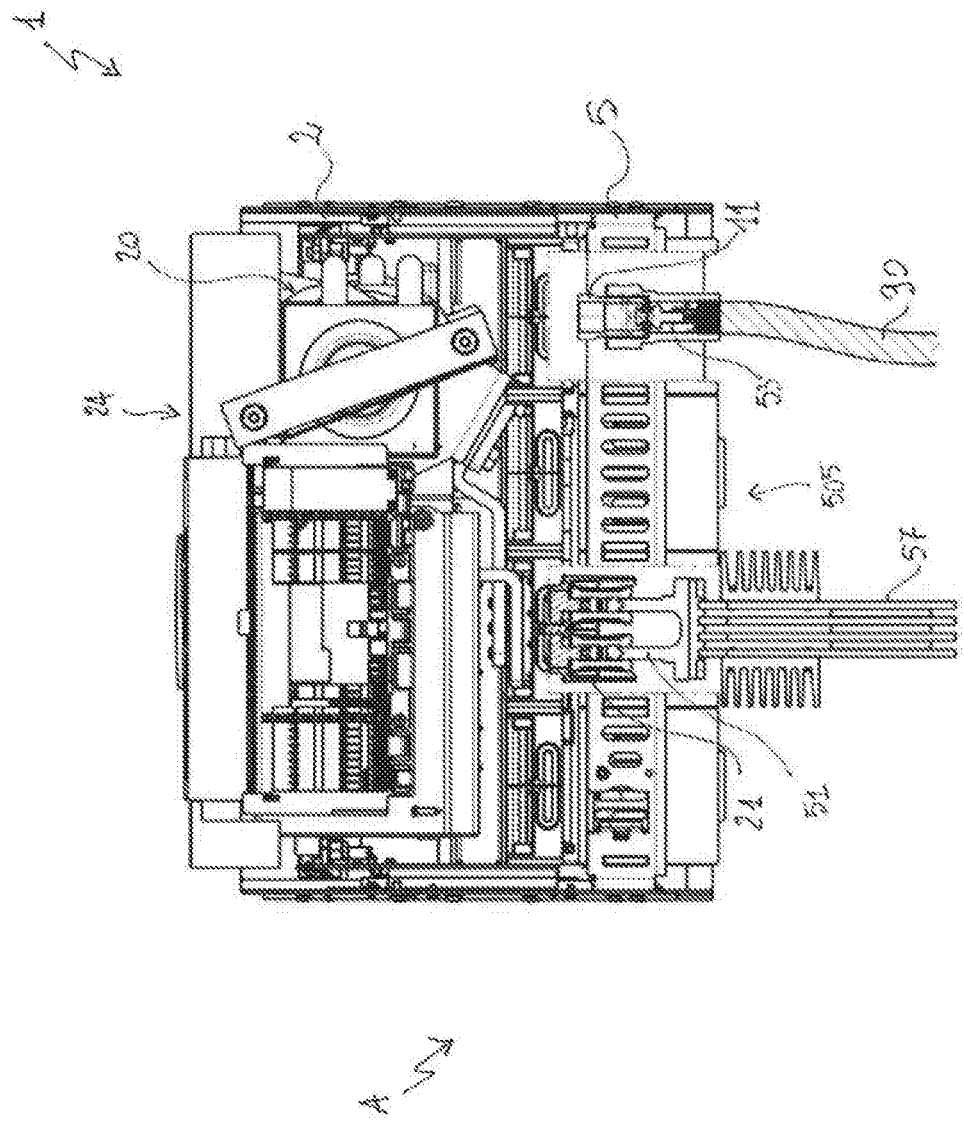
Figure 9:
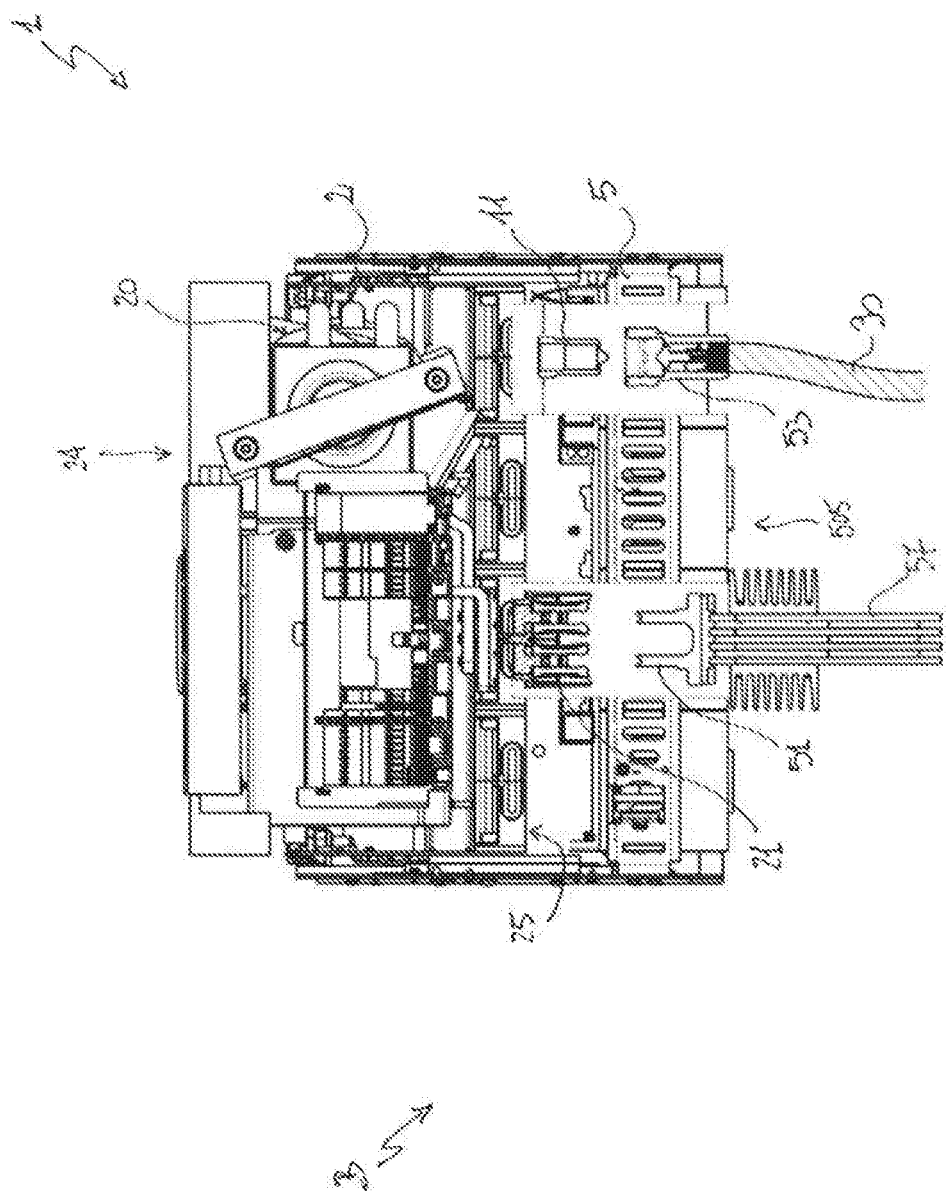
Figure 10:
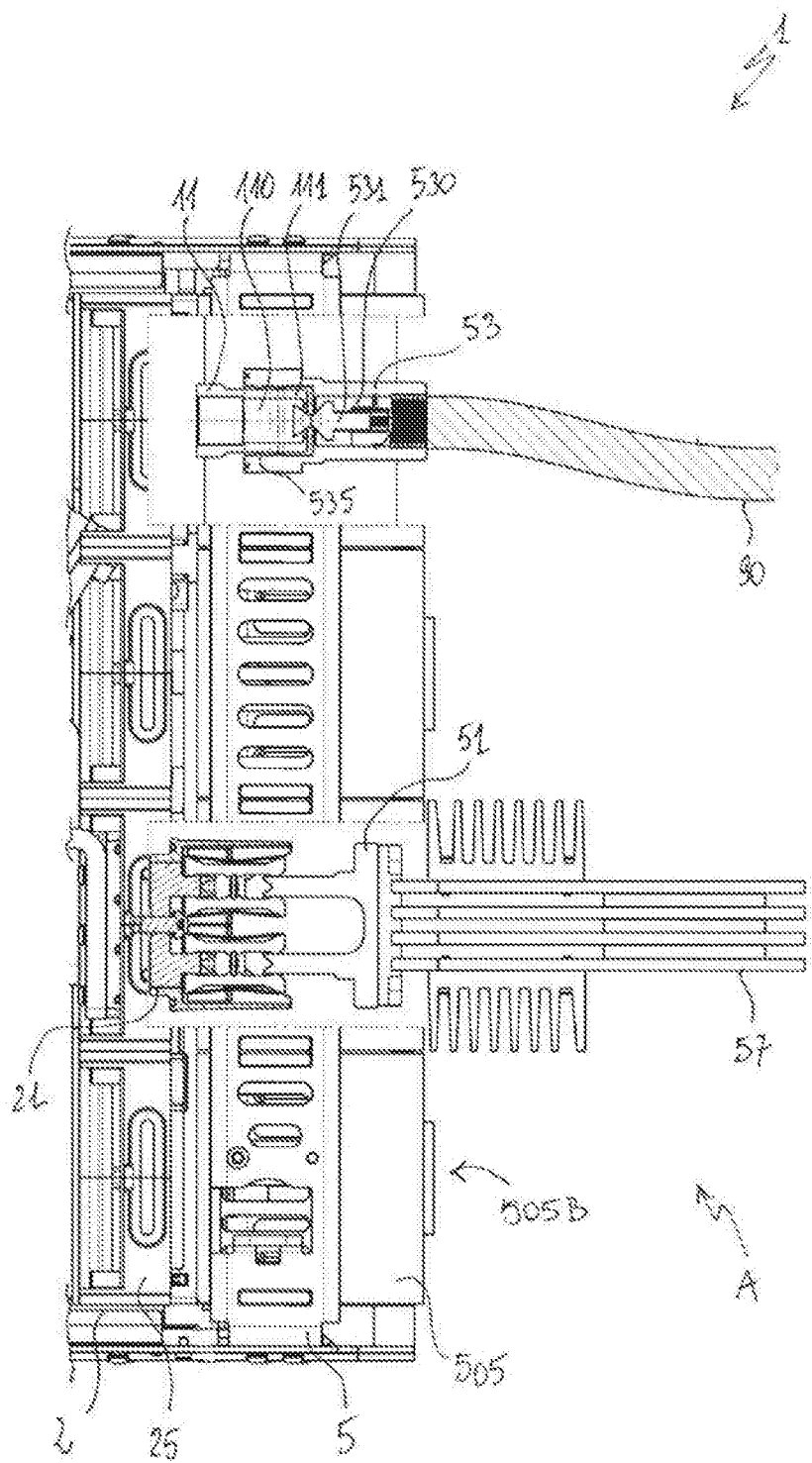

When said switching unit 2 reaches or is in the insertion position A, the first and second hydraulic connectors 11, 12 couple with the third and fourth hydraulic connectors 53, 54, respectively (FIGS. 8, 10).

In this situation, a free circulation of cooling fluid between the source of cooling fluid and the hydraulic circuit 10 (and vice-versa) is achieved thanks to the mutual coupling and interaction of the valve means 111, 121, 531, 541 of the hydraulic connectors 11, 12, 53, 54.

In particular, when said switching unit 2 reaches or is in the insertion position A:
the first valve means 111 of the first hydraulic connectors 11 and the third valve means 531 of the third hydraulic connector 53 mutually couple and interact in such a way to vacate the first and third passages 110, 530 of the first and third hydraulic connectors 11, 53. In this way, the cooling fluid can freely flow along first and third passages 110, 530;
the second valve means 121 of the second hydraulic connectors 12 and the fourth valve means 541 of the fourth hydraulic connector 54 mutually couple and interact in such a way to vacate the second and fourth passages 120, 540 of the second and fourth hydraulic connectors 12, 54. In this way, the cooling fluid can freely flow along second and fourth passages 120, 540.

Figure 11:
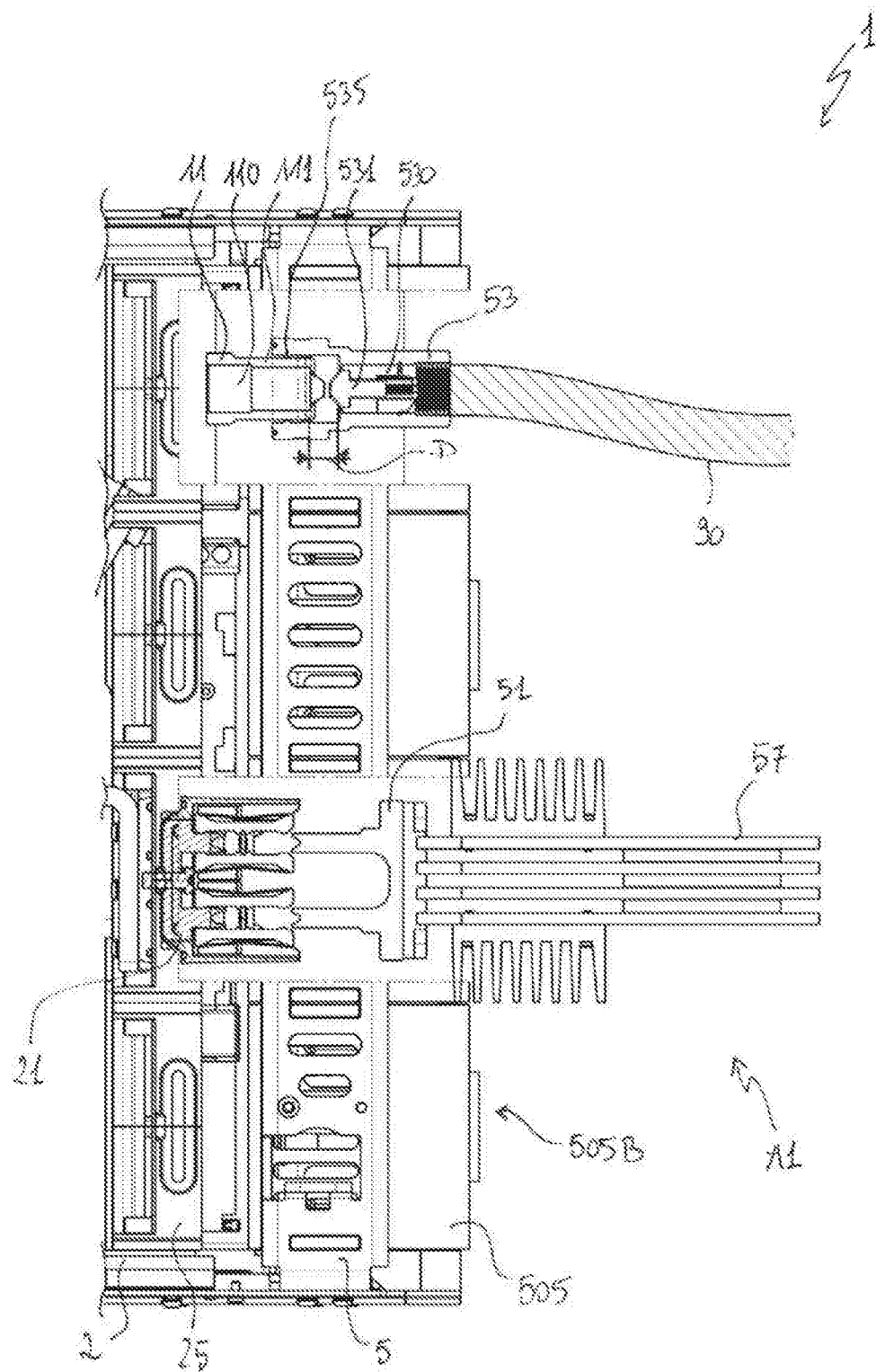
Figure 12:
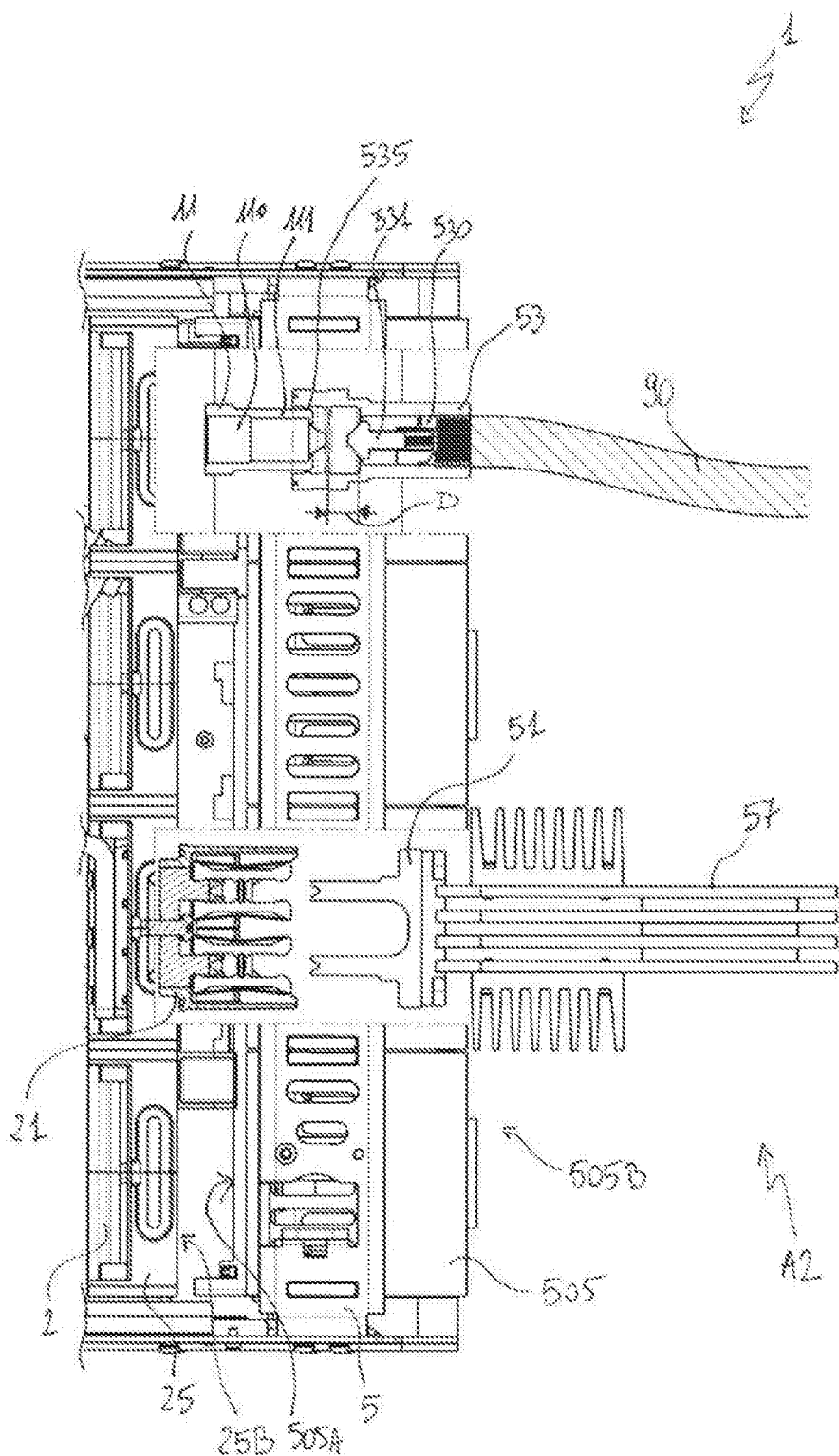
Figure 13:
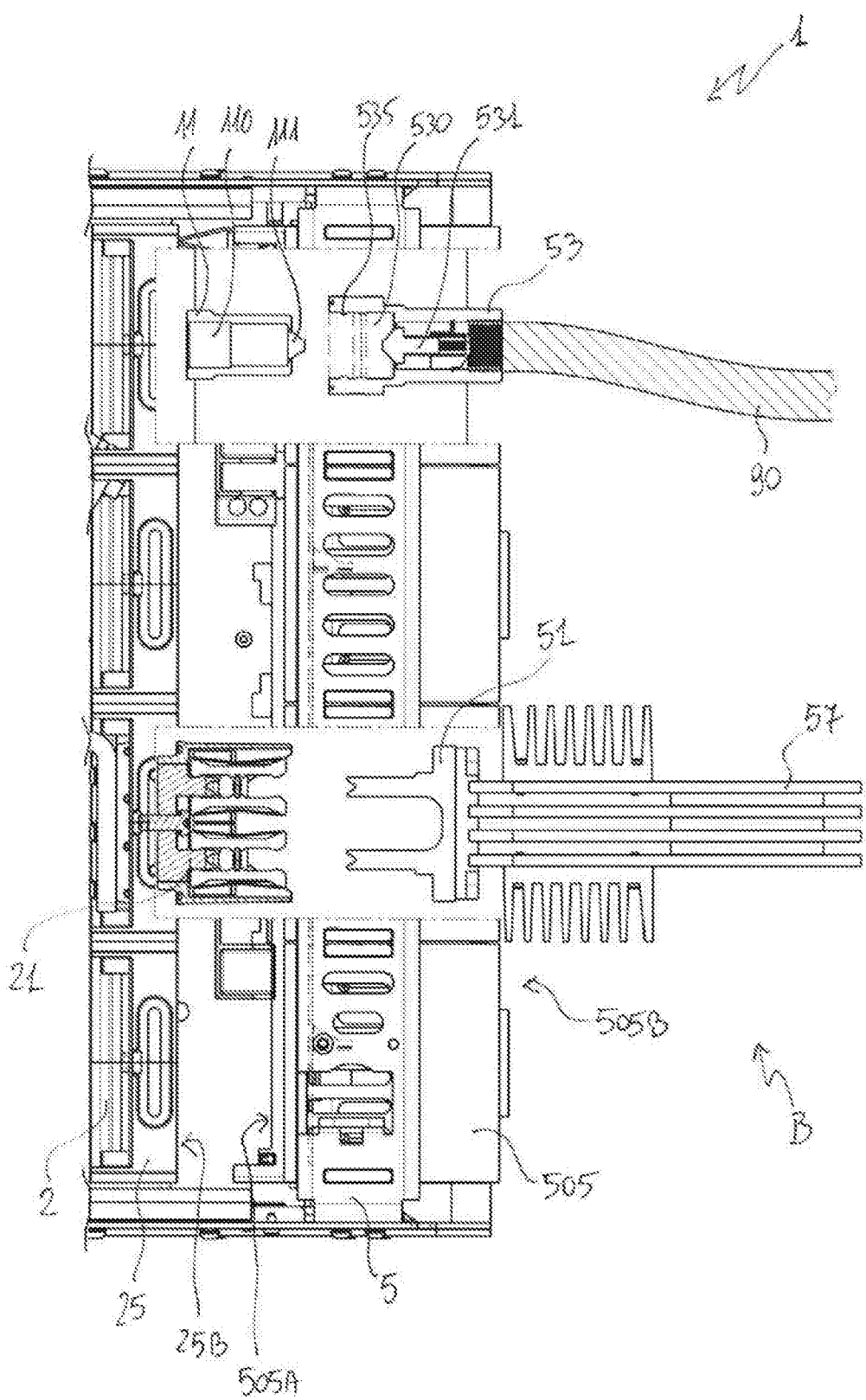

When said switching unit 2 moves away from the insertion position A towards the withdrawn position B, the first and second hydraulic connectors 11, 12 decouple from the third and fourth hydraulic connectors 53, 54, respectively (FIGS. 11-13).

In this situation, the spillage of the cooling fluid from the hydraulic connectors 11, 12, 53, 54 has to be prevented.

Preferably, when the switching unit 2 has covered at least a predefined distance D away from the insertion position A, the spillage of the cooling fluid from the hydraulic connectors 11, 12, 53, 54 is prevented by the valve means 111, 121, 531, 541 themselves.

In particular, when the switching unit 2 has covered at least a predefined distance D (FIG. 11) away from the insertion position A, during the movement towards the withdrawn position B (FIGS. 12-13):
the first valve means 111 are decoupled from the third valve means 531 and obstruct the first passage 110 of the first hydraulic connector 11. In this way, the spillage of the cooling fluid from the first hydraulic connector 11 is prevented;
the second valve means 121 are decoupled from the fourth valve means 541 and obstruct the second passage 120 of the second hydraulic connector 12. In this way, the spillage of the cooling fluid from the second hydraulic connector 12 is prevented;
the third valve means 531 are decoupled from the first valve means 111 and obstruct the third passage 530 of the third hydraulic connector 53. In this way, the spillage of the cooling fluid from the third hydraulic connector 53 is prevented;
the fourth valve means 541 are decoupled from the second valve means 121 and obstruct the fourth passage 540 of the fourth hydraulic connector 54. In this way, the spillage of the cooling fluid from the fourth hydraulic connector 54 is prevented.

Conveniently, the predefined distance D may be of some mm, e.g. in a range between 10-20 mm. Obviously, when said switching unit 2 is in the withdrawn insertion position B (FIGS. 9, 13):
the first valve means 111 are decoupled from the third valve means 531 and obstruct the first passage 110 of the first hydraulic connector 11. In this way, the spillage of the cooling fluid from the first hydraulic connector 11 is prevented;
the second valve means 121 are decoupled from the fourth valve means 541 and obstruct the second passage 120 of the second hydraulic connector 12. In this way, the spillage of the cooling fluid from the second hydraulic connector 12 is prevented;
the third valve means 531 are decoupled from the first valve means 111 and obstruct the third passage 530 of the third hydraulic connector 53. In this way, the spillage of the cooling fluid from the third hydraulic connector 53 is prevented;
the fourth valve means 541 are decoupled from the second valve means 121 and obstruct the fourth passage 540 of the fourth hydraulic connector 54. In this way, the spillage of the cooling fluid from the fourth hydraulic connector 54 is prevented.

Preferably, when the switching unit 2 has not yet covered the predefined distance D away from the insertion position A, the spillage of the cooling fluid from the hydraulic connectors 11, 12, 53, 54 is prevented by one or more gasket means 535, 545 of the hydraulic connectors 11, 12, 53, 54 (FIG. 11).

Preferably, at least one of the first hydraulic connector 11 and the third hydraulic connector 53 comprises first gasket means 535 adapted to prevent the spillage of the cooling fluid from the first and third hydraulic connectors 11 and 53, when the switching unit 2 has not yet covered the predefined distance D, during a movement towards said withdrawal position B.

When the switching unit 2 has not yet covered the predefined distance D, in fact, the corresponding first and third valve means 111, 531 are decoupled one from another but they have not completed the obstruction of the passages 110, 530 of the corresponding hydraulic connectors 11 and 53, yet.

Preferably, the first gasket means 535 are formed by an O-ring arranged in the third hydraulic connector 53.

However, according to different embodiments of the invention (not shown), the above-mentioned first gasket means may be of different type or included in the first hydraulic connector 11 or in each of the hydraulic connectors 11, 53.

Preferably, at least one of the second hydraulic connector 12 and the fourth hydraulic connector 54 comprises second gasket means (not shown) adapted to prevent the spillage of the cooling fluid from the second and fourth hydraulic connectors 12 and 54, when the switching unit 2 has not yet covered the predefined distance D, during a movement towards said withdrawal position (B).

When the switching unit 2 has not yet covered the predefined distance D, in fact, the corresponding second and fourth valve means 121, 541 are decoupled one from another but they have not completed the obstruction of the passages 120, 540 of the corresponding hydraulic connectors 12 and 53, yet.

Preferably, the second gasket means are formed by an O-ring arranged in the fourth hydraulic connector 54.

However, according to different embodiments of the invention (not shown), the above-mentioned second gasket means may be of different type or included in the second hydraulic connector 12 or in each of the hydraulic connectors 12, 54.

In the following, coupling and decoupling of the first hydraulic connector 11 and the third coupling connector 53 are described in more details (FIGS. 10-13) for exemplary purposes. Obviously, the second hydraulic connector 12 and the fourth coupling connector 54 will behave in a same manner.

FIG. 10 shows the switching unit 2 in the insertion position A.

In this case, the first hydraulic connector 11 is coupled with the third hydraulic connector 53.

The first valve means 111 of the first hydraulic connector 11 and the third valve means 531 of the third hydraulic connector 53 are mutually coupled and interact in such a way to vacate the first and third passages 110, 530 of the first and third hydraulic connectors 11, 53. The cooling fluid can therefore flow along first and third passages 110, 530.

FIG. 11 shows the switching unit 2 in an operative position A1, in which the switching unit 2 has not yet covered the predefined distance D away from the insertion position A, during the movement towards the withdrawn position B.

The first hydraulic connector 11 and the third hydraulic connector 53 start decoupling one from another.

In this case, the first valve means 111 of the first hydraulic connector 11 and the third valve means 531 of the third hydraulic connector 53 mutually decouple. However, they are not yet capable of fully obstructing the corresponding passages 110, 530 for the cooling fluid. The gasket means 535 prevent the spillage of cooling fluid from the first and third hydraulic connectors 11, 53.

FIG. 12 shows the switching unit 2 in a further operative position A2, in which the switching unit 2 has already covered the predefined distance D away from the insertion position A, during the movement towards the withdrawn position B.

The first hydraulic connector 11 and the third hydraulic connector 53 continue decoupling one from another.

In this case, the first valve means 111 of the first hydraulic connector 11 and the third valve means 531 of the third hydraulic connector 53 are mutually decoupled. Additionally, they have completed the obstruction of the corresponding passages 110, 530 for the cooling fluid, thereby preventing the spillage of this latter from the first and third hydraulic connectors 11, 53.

FIG. 13 shows the switching unit 2 in the withdrawn position B.

The first and third hydraulic connectors 11, 13 are completely decoupled one from another. The first valve means 111 of the first hydraulic connector 11 and the third valve means 531 of the third hydraulic connector 53 are mutually decoupled and obstruct the corresponding passages 110, 530 for the cooling fluid, thereby preventing the spillage of this latter from the first and third hydraulic connectors 11, 53.

The switching device 1 may be subject to possible variants from those described above.

For example, the power contacts 21, 22, 51, 52, 57, 58 may be differently configured with respect to the embodiment shown in the cited figures.

The hydraulic connectors 11, 12, 53, 54 may be differently configured with respect to the embodiment shown in the cited figures.

The valve means 111, 121, 531, 541 may be differently arranged and differently operate to allow or prevent the flow of the cooling fluid with respect to the embodiment shown in the cited figures.

The supporting frame 5 may include one or more additional hydraulic connections to put the hydraulic connectors 53, 54 in fluid-dynamic communication with the source of cooling fluid.

The switching device 1 of the invention provides relevant advantages with respect to the solutions of the state of the art.

In switching device 1, the switching unit 2 is provided with hydraulic connectors 11, 12 arranged in such a way that they can automatically couple with or decouple from the corresponding hydraulic connectors 53, 54 of the supporting frame 5 upon opposite translatory movements of said switching unit from the withdrawn position B to the insertion position A, an vice-versa, respectively.

The switching device 1 thus allows managing the electric connections and the hydraulic connections of the switching unit 2 in a similar way, i.e. according to a plug & play approach by exploiting a suitable single movement of the switching unit 2 from the withdrawn position B to the insertion position A, or vice-versa.

In fact, the galvanic connection or insulation of the electric poles of the switching unit 2 with/from external electric line portions as well as the hydraulic connection or disconnection of the hydraulic circuit 10 on board the switching unit 2 with or from a source of cooling fluid are carried out by a single insertion or withdrawn operation of the switching unit 2, without the adoption of additional dedicated electric and hydraulic connections.

In this way, no time-consuming manual interventions by specialized personnel are needed, in particular for arranging the hydraulic connections of the switching unit 2.

Thanks to this capability of performing integrated electric and hydraulic connection/disconnection functionalities, the switching device 1 has remarkable advantages in terms of easiness of use, flexibility of use and reliability in operation.

The switching device 1 is characterised by a simplified structure, with a relatively small size, which has proven to be of relatively easy and low-cost realization at industrial level and practical installation on the field.

The invention claimed is:

1. A switching device comprising:
a switching unit having one or more electric poles and comprising, for each electric pole, a first power contact and a second power contact along which a line current can circulate and one or more solid-state switches electrically connected with said first and second power contacts and switchable in a conduction state or in an interdiction state to allow or interrupt a flow of said line current;
a supporting frame adapted to be fixed to a supporting structure and comprising, for each electric pole, a third power contact and a fourth power contact along which said line current can circulate, wherein, in operation, said switching unit is reversibly movable, with respect to said supporting frame, between an insertion position and a withdrawn position, wherein said first power contact and said second power contact are coupled with said third power contact and said fourth power contact, respectively, when said switching unit is in said insertion position, wherein said first power contact and said second power contact are separated from said third power contact and said fourth power contact, respectively, when said switching unit is in said withdrawn position;

wherein:

said switching unit comprises, for each electric pole, at least a first hydraulic connector and a second hydraulic connector along which a cooling fluid adapted to remove heat generated by said solid-state switches can circulate;

said supporting frame comprises at least a third hydraulic connector and a fourth hydraulic connector along which said cooling fluid can circulate;

wherein said first hydraulic connector and said second hydraulic connector are coupled with said third hydraulic connector and said fourth hydraulic connector, respectively, when said switching unit is in said insertion position, wherein said first hydraulic connector and said second hydraulic connectors are separated from said third hydraulic connector and said fourth hydraulic connector, respectively, when said switching unit is in said withdrawn position.

2. The switching device, according to claim 1, wherein said first hydraulic connector, second hydraulic connector, third hydraulic connector and fourth hydraulic connectors further comprise, respectively, a first passage, a second passage, a third passage and a fourth passage for said cooling fluid and comprise, respectively, first valve means, second valve means, third valve means and fourth valve means operatively associated with said first passage, second passage, third passage and fourth passage, said first valve means, second valve means, third valve means and fourth valve means being adapted to allow said cooling fluid to flow along said first passage, second passage, third passage and fourth passage or to obstruct said first passage, second passage, third passage and fourth passage.

3. The switching device, according to claim 2, wherein:
said first valve means of said first hydraulic connector and third valve means of said third hydraulic connector mutually couple and interact to allow said cooling fluid to flow along first and third passages of said first and third hydraulic connectors;

said second valve means of said second hydraulic connector and said fourth valve means of said fourth hydraulic connector mutually coupled and interact to allow said cooling fluid to flow along second and fourth passages of said second and fourth hydraulic connectors;

wherein said switching unit reaches or is in said insertion position.

4. The switching device, according to claim 3, wherein said first and third valve means are mutually decoupled; said second and fourth valve means are mutually decoupled;

wherein said switching unit moves away from said insertion position towards said withdrawn position.

5. The switching device, according to claim 4, wherein:
said first valve means are decoupled from said third valve means and obstruct the first passage of said first hydraulic connector;

said second valve means are decoupled from said fourth valve means and obstruct the second passage of said second hydraulic connector;

said third valve means are decoupled from said first valve means and obstruct the third passage of said third hydraulic connector;

when said switching unit has covered at least a predefined distance away from said insertion position, during a movement towards said withdrawn position, or when said switching unit is in said withdrawn position.

6. The switching device, according to claim 5, wherein at least one of said first and third hydraulic connectors comprises first gasket means to prevent a spillage of said cooling fluid, when said first and third valve means are decoupled one from another and said switching unit has not yet covered said predefined distance away from said insertion position, during a movement towards said withdrawal position.

7. The switching device, according to claim 6, wherein at least one of said second and fourth hydraulic connectors comprises second gasket means to prevent a spillage of said cooling fluid, when said second and fourth valve means are decoupled one from another and said switching unit has not yet covered said predefined distance away from said insertion position, during a movement towards said withdrawal position.

8. The switching device, according to claim 5, wherein at least one of said second and fourth hydraulic connectors comprises second gasket means to prevent a spillage of said cooling fluid, when said second and fourth valve means are decoupled one from another and said switching unit has not yet covered said predefined distance away from said insertion position, during a movement towards said withdrawal position.

9. The switching device, according to claim 7, wherein said first and second power contacts are arranged at an external side of a first back wall of said switching unit and said third and fourth power contacts are arranged at an internal side of a second back wall of said supporting frame, said first and second back walls being operatively coupled one with another, when said switching unit in said insertion position.

10. The switching device, according to claim 3, wherein:
said first valve means are decoupled from said third valve means and obstruct the first passage of said first hydraulic connector;

said second valve means are decoupled from said fourth valve means and obstruct the second passage of said second hydraulic connector;

said third valve means are decoupled from said first valve means and obstruct the third passage of said third hydraulic connector;

said fourth valve means are decoupled from said second valve means and obstruct the fourth passage of said fourth hydraulic connector;

when said switching unit has covered at least a predefined distance away from said insertion position, during a movement towards said withdrawn position, or when said switching unit is in said withdrawn position.

11. The switching device, according to claim 3, wherein said supporting frame comprises, for each electric pole, a fifth power contact and a sixth power contact along which said line current can circulate, said fifth and sixth power contacts being electrically connected with said third and fourth power contacts, respectively, and being, in operation, electrically connected with a first electric line portion and a second electric line portion, respectively.

12. The switching device, according to claim 3, wherein said third hydraulic connector and said fourth hydraulic connector are, in operation, in fluid-dynamic communication with a fluid source of said cooling fluid.

13. The switching device, according to claim 1, wherein said first and second power contacts are arranged at an external side of a first back wall of said switching unit and said third and fourth power contacts are arranged at an internal side of a second back wall of said supporting frame, said first and second back walls being operatively coupled one with another, when said switching unit in said insertion position.

14. The switching device, according to claim 13, wherein said first and second hydraulic connectors are arranged at an external side of a first back wall of said switching unit and said third and fourth hydraulic connectors are arranged at an internal side of a second back wall of said supporting frame, said first and second back walls being operatively coupled one with another, when said switching unit in said insertion position.

15. The switching device, according to claim 1, wherein said first and second hydraulic connectors are arranged at an external side of a first back wall of said switching unit and said third and fourth hydraulic connectors are arranged at an internal side of a second back wall of said supporting frame, said first and second back walls being operatively coupled one with another, when said switching unit in said insertion position.

16. The switching device, according to claim 15, wherein said fifth and sixth power contacts are arranged at an external side of a second back wall of said supporting frame.

17. The switching device, according to claim 1, wherein said supporting frame comprises, for each electric pole, a fifth power contact and a sixth power contact along which said line current can circulate, said fifth and sixth power contacts being electrically connected with said third and fourth power contacts, respectively, and being, in operation, electrically connected with a first electric line portion and a second electric line portion, respectively.

18. The switching device, according to claim 17, wherein said fifth and sixth power contacts are arranged at an external side of a second back wall of said supporting frame.

19. The switching device, according to claim 1, wherein said third hydraulic connector and said fourth hydraulic connector are, in operation, in fluid-dynamic communication with a fluid source of said cooling fluid.

20. The switching device, according to claim 1, wherein said switching unit comprises an intermediate hydraulic circuit section in fluid-dynamic communication with said first and second hydraulic connectors, said intermediate hydraulic circuit section comprising one or more heat exchange portions in fluid communication one with another, each heat exchange portion including one or more heat exchanging surfaces for absorbing heat from a corresponding solid-state switch.

* * * * *